United States Patent [19]

Brokaw

[11] Patent Number: 4,857,862
[45] Date of Patent: Aug. 15, 1989

[54] HIGH-GAIN IC AMPLIFIER

[75] Inventor: Adrian P. Brokaw, Burlington, Mass.

[73] Assignee: Analog Devices, Incorporated, Norwood, Mass.

[21] Appl. No.: 178,121

[22] Filed: Apr. 6, 1988

[51] Int. Cl.⁴ .............................................. H03F 3/45
[52] U.S. Cl. .................................... 330/261; 330/257
[58] Field of Search ............... 330/252, 254, 257, 260, 330/261

[56] References Cited

U.S. PATENT DOCUMENTS 4,746,874  5/1988  Forster et al. ...................... 330/261

Primary Examiner—Gene Wan
Attorney, Agent, or Firm—Parmelee, Bollinger & Bramblett

[57] ABSTRACT

An amplifier of the type having a differential input stage driving an active load which produces a single-ended output directed to a voltage-gain stage. The gain of the amplifier is isolated from the effects of load changes by a biasing circuit which forces the differential input stage to remain balanced at all times.

15 Claims, 1 Drawing Sheet

HIGH-GAIN IC AMPLIFIER

BACKGROUND OF THE INVENTION

1. Field of the Invention

This invention relates to amplifiers. More particularly, this invention concerns an amplifier of simple design which is formed as part of an integrated-circuit (IC) chip and provides high loop gain as well as other desirable characteristics.

2. Description of the Prior Art

A wide variety of circuit designs have been used for amplifiers formed on IC chips. Operational amplifiers are employed extensively, and usually comprise a differential input stage and a single-ended output stage. Commonly, an active load such as a PNP current mirror will be coupled to the collectors of the differential-stage transistors. The single-ended output of the current mirror can drive one or more voltage-gain stages.

Although such amplifiers have served many practical purposes, their performance is not fully satisfactory in certain respects. For example, the gain of prior amplifiers tends to vary to an undesired degree with changes in load, e.g. due to variations in ambient temperature. Still other aspects of prior amplifier designs require improvement to meet the needs of modern precision linear components.

SUMMARY OF THE INVENTION

In a preferred embodiment of the invention, to be described hereinbelow in detail, there is provided an amplifier of the type having a differential input stage driving an active load which produces a single-ended output directed to a voltage-gain stage. The gain of the amplifier is isolated from the effects of load changes by a biasing circuit which forces the differential input stage to remain balanced at all times. The overall gain of the amplifier can be extremely high, for example, a gain of 2 million can be achieved in practice.

Other objects, aspects and advantages of the invention will in part be pointed out in, and in part apparent from, the following detailed description considered together with the accompanying drawing.

DESCRIPTION OF THE PREFERRED EMBODIMENT

Figure 1:
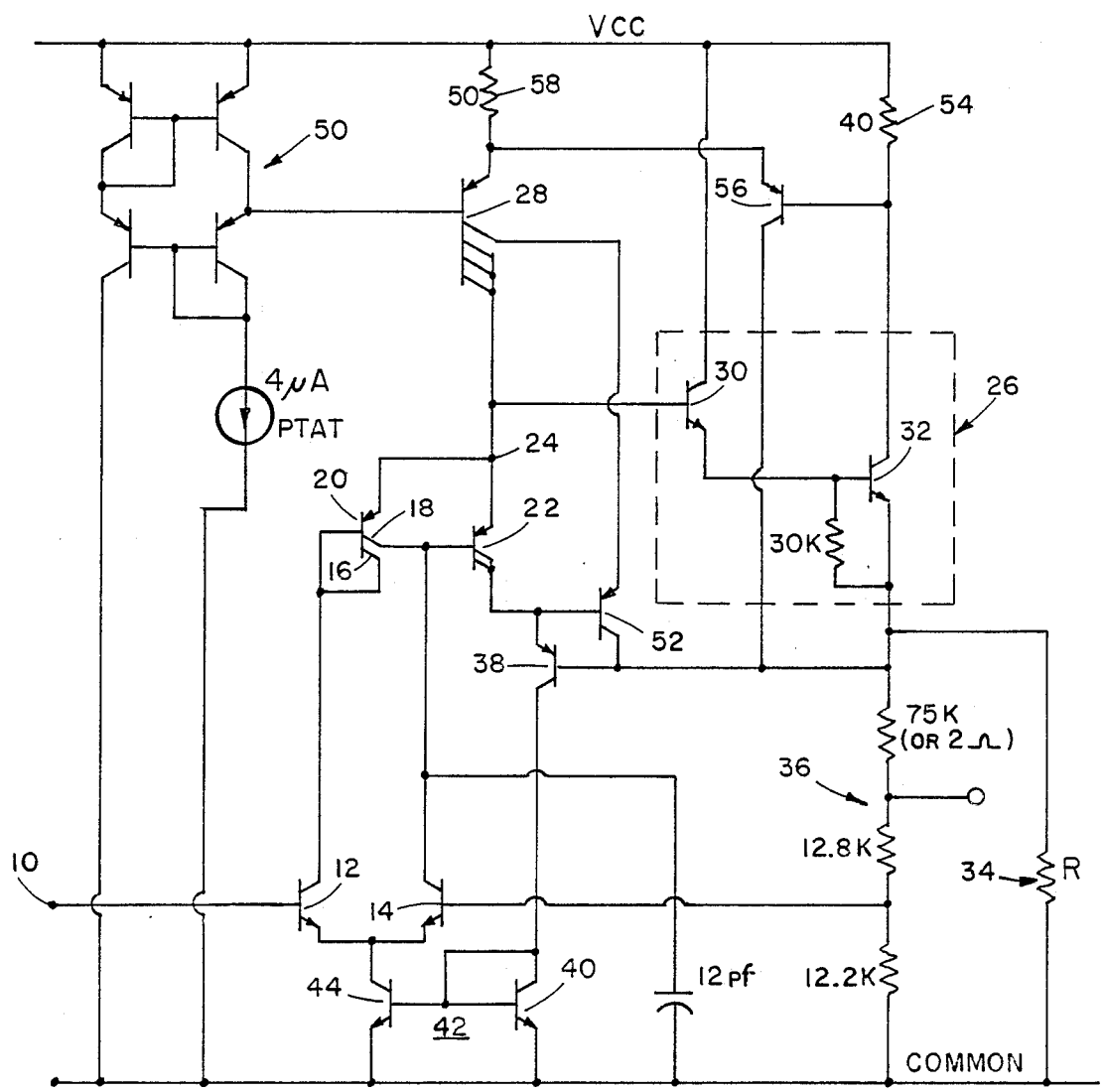
FIG. 1 is a schematic diagram showing the circuit arrangement of a preferred amplifier in accordance with the invention.

Referring now to the lower-left-hand corner of the drawing, the amplifier includes an input circuit terminal 10 to which the input signal is applied. The input signal may be derived from any of a variety of voltage sources, such as the output voltage of a band gap voltage reference. The input signal is directed from terminal 10 to the base of one transistor 12 of a simple matched differential pair with common emitters, i.e. the emitters of the two transistors are coupled together, either directly (as shown) or indirectly. The base of the other differential transistor 14 receives a signal which, in this embodiment, is developed by a resistive negative feedback circuit coupled to the amplifier output circuit, as will be described subsequently. Thus it will be seen that the amplifier in this embodiment is arranged as a follower with gain.

The collectors of the differential transistors 12 and 14 are connected respectively to split collectors 16, 18 of a PNP transistor 20 serving as a differential-to-single-ended converter. This transistor is arranged as a current mirror providing an active load for the differential input stage. The upper collector 18 provides a single-ended output from the current mirror, and drives the base of a PNP voltage-gain transistor 22, connected common emitter with transistor 20. The voltage-gain transistor 22 forms part of the output circuit.

The common emitters of transistors 20 and 22 together provide an output terminal element for the first stage (the output terminal being identified on the drawing as circuit point 24). This output terminal in turn is connected to a further part of the output circuit generally indicated at 26. The output load comprises all the circuitry connected to terminal point 24, including the output circuitry 26 and a multi-collector transistor 28 to be described hereinbelow.

The output circuitry 26 comprises a pair of Darlington-connected transistors 30, 32 which drive an external load 34. The load resistor 34 is paralleled by a resistor string 36 from which is derived a negative feedback signal for the base of the second transistor 14 of the differential input pair.

The voltage-gain transistor 22 includes dual collectors which are connected together and to the emitter of another PNP transistor 38 acting as a cascode. This cascode transistor 38 raises the output impedance of the amplifier, an important feature when the dynamic impedance of the load is relatively high.

The collector current of the cascode transistor 38 drives one transistor 40 of a current mirror generally indicated at 42. The other mirror transistor 44 supplies the bias tail current for the differential input transistors 12, 14. This mirror 42 thus reflects the current of the voltage-gain transistor 22 through the cascoded transistor 38 to the emitters of the differential input transistors 12, 14.

The emitter current for the transistors 12, 14 will also flow in the load, that is, in the circuitry connected to circuit point 24. The load current comprises the current of the three paralleled collectors of transistor 28 and the very small amount of base current for the first Darlington transistor 30.

The current through the current mirror transistor 20 will be essentially equal to that of the voltage-gain transistor 22. This is so because the currents in mirror transistors 44 and 40 will necessarily be equal, and therefore the corresponding currents flowing in transistors 20 and 22 also must be equal. Thus the total signal current in the load at current point 24 will be essentially twice the current in the voltage-gain transistor 22. In effect, the transconductance of transistor 22 is doubled by this re-use of its current. This raises the overall gain by about 6 dB.

Yet a still more important result is however achieved by this biasing circuitry for the differential input stage transistors 12, 14. In more detail now, as noted above, the current mirror 42 forces the load current at circuit point 24 to split equally between the two common-emitter transistors 20, 22. Moreover, the base currents of transistors 20 and 22 also will be equal, and will add respectively to the equal currents of the split collectors of transistor 20. (The cascode action of transistor 38 insures that the collector voltage of the voltage-gain transistor 22 will be very nearly the same as its base voltage—and the base voltage of transistor 20—so that the Early effect will not unbalance the base currents. Accordingly, the currents in the collectors of transistors 12 and 14 will be maintained essentially equal.

Consequently, it will be seen that the differential input stage comprising transistors 12 and 14 always will be forced to be in balance by the biasing circuitry described. Changes in load current change the base voltages and the base currents of both transistors 20 and 22 in such a way that the input stage remains in balance. This in effect makes the amplifier gain independent of changes in the load.

It may be noted that the load at circuit point 24 is driven by the emitters of transistors 20 and 22. This load connection to the emitters makes it possible to get at the collector current of the voltage-gain transistor 22 to use it to hold constant the ratio of the currents in the input stage transistors 12 and 14. This result is achieved by holding constant the ratio of the load current to the tail current of the input differential stage. As a consequence the differential voltage at the input stage is always extremely small.

The apparent load independence for the amplifier gain only works well over the range of currents where the transistors involved can operate normally. The Darlington transistors 30, 32 assist in that regard, making it possible to develop substantial current for the external load 34 without reflecting significantly on the functioning of the previous stages. The Darlingtons also provide base bias for the cascode transistor 38.

The operating current for the amplifier comes from the multi-collector transistor 28. This transistor is biased by a conventional circuit generally indicated at 50 which in the particular embodiment caused transistor 28 to produce a total of about 4 $\mu$A, and reduced the power supply voltage sensitivity. The transistor current is split by the multiple collectors, with about 3 $\mu$A flowing into the common-emitter transistors 20, 22 and about 1 $\mu$A driving another transistor 52. This latter transistor provides a tiny current from its base to start the loop which runs from the emitter of the cascode transistor 38, to the current mirror 42, through the right-hand input transistor 14 to the base of the voltage-gain transistor 22 and finally back to the cascode transistor 38. The little current from the base of transistor 52 insures that this loop will start. Its magnitude is comparable to the base current of the cascode transistor 38 so that it reduces the error which results from the loss of collector current from voltage-gain transistor 22 by way of the base of the cascode transistor.

A current-limiting arrangement also is included as part of the amplifier. A resistor 54 is connected in series with the output Darlington transistor 32, which carries most of the output current, thereby to develop a voltage corresponding to that output current. This voltage drives the base of a control transistor 56 which can rob emitter current from the multi-collector transistor 28. In order to make a big change in the emitter current, the control transistor 56 has to deliver a fairly large current to a resistor 58 in series with that emitter. This has the useful effect of "sharpening" the current limit, because when the control transistor draws sufficient current for that purpose it has a high transconductance, so that further changes in the voltage across resistor 54 translate directly to the emitter of transistor 28. Although the control transistor 56 has a high transconductance, transistor 28 has a low transconductance which goes even lower with the onset of current limiting. As the latter transistor current is reduced, the amplifier continues to operate more or less normally due to low sensitivity to its load current. Ultimately, as the current from the collectors of transistor 28 is reduced to the base current required by transistor 30 to supply the load, the amplifier will be completely starved and the output voltage will fall with any further loading.

Although a specific preferred embodiment of the invention has been described herein in detail, this has been for the purpose of illustrating the principles of the invention, and should not necessarily be construed as limiting the invention since it is apparent that those skilled in the art can make many modified arrangements of the invention without departing from the true scope thereof. For example, the input matched differential pair could be replaced by a mismatched pair to force a proportional-to-absolute-temperature (PTAT) current for a band-gap circuit. Alternatively, the regulated output could be used to light up a basic band-gap reference which could be boosted by the amplifier. Still other variations will be apparent to those of skill in the art.

What is claimed is:

1. An integrated-circuit high-gain amplifier comprising:
   a differential amplifier stage including a pair of transistors with common emitters;
   an input circuit connected to the base of one of said pair of transistors to receive an input signal;
   transistor means arranged as a differential-to-single-ended converter and driven by said differential amplifier;
   said transistor means having an output element producing a single-ended output signal;
   an output circuit connected to said output element;
   signal means coupled to the base of the other of said pair of transistors; and
   bias means for said differential amplifier, said bias means including circuit means for maintaining the currents through said differential pair of transistors in constant ratio substantially without regard to changes in load at said output element.

2. An IC amplifier as in claim 1, wherein said signal means comprises means coupled between said output circuit and said other base.

3. An IC amplifier as in claim 1, wherein said transistor means comprises a transistor having its emitter serving as said output element.

4. An IC as in claim 3, wherein said output circuit comprises a voltage-gain-transistor coupled to said transistor means, the emitter of said voltage-gain transistor being connected to said transistor means emitter and driving said load.

5. An IC amplifier as in claim 4, wherein said transistor means includes means providing a current mirror having a pair of collectors connected respectively to the collectors of said differential pair of transistors;
   one of said transistor means collectors also being connected to the base of said voltage-gain transistor.

6. An IC amplifier as in claim 1, wherein said bias circuit means comprises feedback means responsive to a current developed in said output circuit for maintaining said differential amplifier in balance.

7. An IC amplifier as in claim 6, wherein said transistor means comprises a transistor having an emitter serving as said output element;
   said output circuit including a voltage-gain transistor with its emitter connected to said transistor means emitter;

said bias feedback means being responsive to the current through said voltage-gain transistor.

8. An IC amplifier as in claim 7, wherein said bias feedback means comprises a current mirror having as its input the current through said voltage-gain transistor; the output of said current mirror providing the tail current for the emitters of said differential pair.

9. An IC amplifier as in claim 8, wherein said current mirror input is the collector current of said voltage gain transistor.

10. An IC amplifier as in claim 1, including a load connected to said transistor means to carry the current passing through said transistor means to said differential amplifier;
a voltage-gain transistor coupled to said transistor means;
means connecting an element of said voltage-gain transistor to said load so that the load carries the current passing through said voltage-gain transistor; and
means for forcing the load current to be shared equally by said transistor means and said voltage-gain transistor.

11. An IC amplifier as in claim 10, wherein said load is connected to an emitter of said transistor means and to the emitter of said voltage-gain transistor.

12. An IC amplifier as in claim 10, wherein said forcing means comprises a current mirror responsive to the collector current of said voltage-gain transistor and operable to produce a matching tail current for said differential pair of transistors.

13. In an IC amplifier, an output current limiter which operates by depriving the amplifier of operating current without substantially unbalancing the amplifier until the operating bias levels are insufficient to drive the overload.

14. An integrated-circuit amplifier comprising:
a pair of transistors each having a base, said transistors further including collector and emitter electrodes;
means connecting one set of common electrodes of said transistors together;
means to supply voltage signals to the bases of said pair of transistors;
transistor means arranged as a differential-to-single-ended converter and driven by said pair of transistors;
an output circuit connected to said transistor means to develop an output signal; and
feedback means receiving a feedback signal from said output circuit and coupled to said common electrodes of said pair of transistors, said feedback means including a current mirror arranged to force the current through said pair of transistors to track said feedback signal from said output circuit.

15. An amplifier as claimed in claim 14, wherein said set of common electrodes comprise the emitters of said pair of transistors;
said collectors of said pair of transistors being coupled to said transistor means to control the current thereto.

* * * * *